United States Patent
Büchel et al.

(10) Patent No.: US 8,310,240 B2
(45) Date of Patent: Nov. 13, 2012

(54) MONITORING CIRCUIT FOR AN ENERGY STORE AND METHOD FOR MONITORING AN ENERGY STORE

(75) Inventors: Mathias Büchel, München (DE); Markus Gilch, Mauern (DE); Uwe Zimmermann, Lichtenstein Ot Roedlitz (DE)

(73) Assignee: Continental Automotive GmbH, Hannover (DE)

( * ) Notice: Subject to any disclaimer, the term of this patent is extended or adjusted under 35 U.S.C. 154(b) by 305 days.

(21) Appl. No.: 12/809,165

(22) PCT Filed: Dec. 18, 2008

(86) PCT No.: PCT/EP2008/067841
§ 371 (c)(1),
(2), (4) Date: Jun. 18, 2010

(87) PCT Pub. No.: WO2009/080686
PCT Pub. Date: Jul. 2, 2009

(65) Prior Publication Data
US 2010/0308836 A1 Dec. 9, 2010

(30) Foreign Application Priority Data
Dec. 20, 2007 (DE) .......................... 10 2007 061 539

(51) Int. Cl.
*G01N 27/416* (2006.01)
*G01R 31/26* (2006.01)
(52) U.S. Cl. .................................. 324/434; 324/761.01
(58) Field of Classification Search .. 324/762.01–762.1, 324/764.01, 761.01, 433–434, 426, 430; 320/116, 119; 257/48; 438/14–18
See application file for complete search history.

(56) References Cited

U.S. PATENT DOCUMENTS

| 5,438,270 | A | 8/1995 | Harper et al. |
| 5,617,004 | A * | 4/1997 | Kaneko .......................... 320/119 |
| 6,147,499 | A * | 11/2000 | Torii et al. ...................... 324/434 |
| 6,255,826 | B1 * | 7/2001 | Ohsawa et al. ................ 324/426 |
| 6,297,618 | B2 * | 10/2001 | Emori et al. ................... 320/132 |
| 6,329,792 | B1 | 12/2001 | Dunn et al. |
| 6,919,706 | B2 | 7/2005 | Furukawa |
| 2002/0047685 | A1 | 4/2002 | Perelle |
| 2004/0199343 | A1 | 10/2004 | Cardinal et al. |

FOREIGN PATENT DOCUMENTS

| DE | 2227964 A1 | 12/1972 |
| DE | 31461141 A1 | 6/1983 |
| DE | 10246107 A1 | 4/2004 |
| DE | 10250520 A1 | 5/2004 |
| DE | 60024753 T2 | 7/2006 |
| EP | 1391962 A1 | 2/2004 |

* cited by examiner

*Primary Examiner* — Tung X Nguyen
(74) *Attorney, Agent, or Firm* — Laurence A. Greenberg; Werner H. Stemer; Ralph E. Locher

(57) ABSTRACT

A monitoring circuit is provided for an energy storage device. The energy storage device has a plurality of cells which each provide a voltage between their first and second connections and are switched in series. At least two voltage measuring circuits are provided, wherein the voltage measuring circuits each measure the voltage between a first measurement input and a second measurement input. A first connection conductor connects the first terminal of the first cell to the first measurement input of a first voltage measurement circuit. A second connection conductor connects the second terminal of the first cell to the second measurement input of a first voltage measurement circuit. A first load resistor can be switched between the first measurement input of the second voltage measurement circuit and a first fixed potential.

14 Claims, 3 Drawing Sheets

MONITORING CIRCUIT FOR AN ENERGY STORE AND METHOD FOR MONITORING AN ENERGY STORE

BACKGROUND OF THE INVENTION

Field of the Invention

The invention relates to a monitoring circuit for an energy store and to a method for monitoring an energy store. A battery used in an electric vehicle has to generate a high voltage for operating the drive unit. The battery usually has a plurality of cells each providing a voltage and connected in series. The individual cells ought therein to be protected from overvoltage. Shown therefore in US 2002/0047685 A1 is a monitoring circuit that monitors the individual cells, with a multiplicity of voltage-measuring circuits measuring the voltages at the individual cells.

In order to be able to perform the measurements it is necessary to provide connecting leads between the cells and voltage-measuring circuits. It has therein been established that the overvoltages were not measured reliably in the case of conventional monitoring circuits, particularly when the energy stores and monitoring circuit have already been in operation for a long time.

Brief Summary of the Invention

The object of the invention is therefore to disclose an as economical as possible monitoring circuit by means of which the cells of an energy store can be reliably recognized. It is also an object of the invention to provide a method for monitoring cells of an energy store.

Said objects are achieved by means of the subject matter of the independent claims. Advantageous embodiments will emerge from the respective subclaims.

A monitoring circuit for an energy store is inventively provided. Said energy store has a multiplicity of cells each having a first and a second terminal. The cells provide a voltage in each case between their first and second terminal. The cells are connected in series, a second terminal of a first cell being connected in each case to a first terminal of a second cell.

The monitoring circuit contains at least two voltage-measuring circuits that each measure a voltage between a first measuring input and a second measuring input. The second terminal of a first voltage-measuring circuit is connected to the first measuring input of a second voltage-measuring circuit. A first connecting lead serves to connect the first terminal of the first cell to the second measuring input of the first voltage-measuring circuit.

The monitoring circuit further contains a first connecting lead for connecting the first terminal of the first cell to the first measuring input of a first voltage-measuring circuit and a second connecting lead for connecting the second terminal of the first cell to the second measuring input of the first voltage-measuring circuit.

Provided additionally is a first loading resistor. The first loading resistor is provided capable of being switched between the second measuring input of the first voltage-measuring circuit and a first fixed potential. That means that the loading resistor is either switched such as to provide a resistive link between the first measuring input of the first measuring circuit and the first fixed potential or switched such as not to form a resistive link between the measuring input of the first voltage-measuring circuit and the first fixed potential.

By means of the loading resistor, the monitoring circuit enables measuring inputs that are no longer connected to the cells to be taken to another potential. Since the loading resistor influences the measured value of the voltage on the voltage-measuring circuits, the loading resistor is provided capable of being switched so that the voltages on the cells are measured once with and once without the load. Especially in the field of vehicle construction the energy stores should last for years or decades. The energy stores are usually welded on a metal sheet and hence secured mechanically stably, but the connecting leads between the cells and voltage-measuring devices have proved to be weak points. If said connecting leads become corroded or break due to mechanical stress, that could not be reliably detected with the conventional monitoring circuits.

An inventive monitoring circuit improves conventional monitoring circuits to the effect that breaks in the connecting leads also will not result in cells being tested as good although an overvoltage is actually being applied to them. The useful life of the cells and hence of the energy store as a whole will be prolonged thereby.

A second loading resistor is preferably additionally provided capable of being switched between the second measuring input of the first voltage-measuring circuit and a second fixed potential. The second fixed potential can therein in this context be the same fixed potential as the first fixed potential for the first loading resistor or different therefrom. The second connecting lead can be additionally monitored by means of the second loading resistor.

In one embodiment variant the voltage-measuring circuit has an internal resistor between its two measuring inputs. Said internal resistor has an ohmic resistance value of $R_h$. The first loading resistor and second loading resistor each have an ohmic resistance value of $R_n$ and what applies is $R_n < R_h$. It is ensured thereby that the loading resistors will in the event of a fault distinctly alter the voltages requiring to be measured so that the voltage-measuring circuit will also detect a broken lead.

Values of $R_h$ and $R_n$ are preferably selected such that $R_n < 10 \cdot R_h$. The potential in the case of a broken or very highly resistive connecting lead will thereby be taken to a level close to the fixed potential also for cells whose potentials are very far removed from the fixed potential, for example at 300V.

In one embodiment variant the first loading resistor and second loading resistor are each connected in series with a diode. Said series connections formed from a loading resistor and diode each have a first and a second external terminal. Further provided is a transistor that has a first load path with a first terminal and a second terminal. The first terminal of the transistor's load path is connected to the fixed potential while the second terminal of the transistor's load path is connected to the first terminals of the series connections formed from a loading resistor and diode. By means of the transistor, all the loading resistors are simultaneously connected to the fixed potential or, as the case may be, jointly separated therefrom. This embodiment variant has the advantage that only one transistor has to be provided as a switch. The diodes serve to ensure that the currents through a loading resistor will not excessively influence the potential on a connecting lead that is not connected to the first loading resistor.

In a further embodiment variant a switch is provided that is connected in series with the first loading resistor. The series connection formed from a switch and a first resistor is connected between the voltage-measuring circuit's first measuring terminal and the fixed potential, the switch being cyclically switched on and off. Cyclically switching on and off causes the voltages on the voltage-measuring circuits to be regularly measured with and without the connections to the fixed potential via the loading resistor. A regular check will thereby be carried out to determine whether the connecting leads are defective.

The monitoring circuit is especially suitable for cells embodied as rechargeable batteries. Batteries of said type must in particular be protected against overvoltage in order not to adversely affect the energy store's useful life. It must be taken into account that the probability of an outage increases for energy stores having a multiplicity of cells, for example 100. Particular attention should therefore be paid to the functionality of each individual cell in the case of such stores.

Constituting another application are capacitor stacks that are employed for example in vehicles for providing a voltage of, for instance, 40V for high-current loads. Here it is particularly important to ensure that individual capacitors do not break down and conduct, because increased voltages will then be applied to the other capacitors. Here, too, breaks in the connecting leads will make it impossible for the voltages at the individual capacitors to be measured.

The first fixed potential and second fixed potential are preferably both connected to ground. The advantage of using ground as the fixed potential is that said potential is as a rule independent of power generating and so will remain stable even when the power supply is faulty.

Preferably provided furthermore are a third connecting lead for connecting the second terminal of the second cell to the second measuring input of the second voltage-measuring circuit and a third loading resistor for a connection that can be switched between the second measuring input of the second voltage-measuring circuit and a fixed potential. Said third connecting lead will hence also be monitored. The monitoring circuit can be expanded for a multiplicity of cells by providing a loading resistor for each connecting lead.

The invention also provides a method for monitoring an energy store. The energy store therein has a multiplicity of cells that each have a first and second terminal and each provide a voltage between their first and second terminal. The cells are connected in series, with in each case a second terminal of a first cell being connected to a first terminal of a second cell.

An inventive monitoring circuit is provided at a step a) of the method. The first loading resistor is switched at a step b) in such a way that the first loading resistor does not form a connection between the second measuring input of the first voltage-measuring circuit and the first fixed potential.

The voltage at the measuring inputs of the first voltage-measuring circuit is measured at a further step c), after which the first loading resistor is at a step d) switched in such a way that the first loading resistor will form a connection between the second measuring input of the first voltage-measuring circuit and the first fixed potential. The voltage at the measuring inputs of the first voltage-measuring circuit is then measured again at a step e). The first measurement is then compared according to a step f) with the second measurement.

Breaks in the second connecting lead will be revealed by the two measurements. The first loading resistor, if forming a connection between the input of the voltage-measuring circuit and the fixed potential, forces the node which due to the defect is no longer being powered via the connecting lead to a predetermined potential. That will be recognized by the monitoring circuit.

In an embodiment variant of the method, at step a) a monitoring circuit is provided in which a second loading resistor is provided capable of being switched between the first measuring input of the first voltage-measuring circuit and a second fixed potential. Prior to step c), a switching step is provided during which the second loading resistor is switched in such a way that the second loading resistor does not form a connection between the first measuring input of the first voltage-measuring circuit and the second fixed potential.

At step e) the second loading resistor is switched in such a way that the second loading resistor will form a connection between the first measuring input of the first voltage-measuring circuit and the second fixed potential.

Status information is preferably output in each case during measuring at step c) and during measuring at step e). Said status information indicates whether undervoltage, overvoltage or normal voltage is present. The status information output at step c) is compared at step f) with the status information output at step e). Using the status information enables the comparison to be conducted very simply and relieves a user from the question as to what deviations in the measurements can still be tolerated and which indicate a defect.

The invention is illustrated in more detail in the drawings with reference to an exemplary embodiment.

DESCRIPTION OF THE INVENTION

Figure 1:
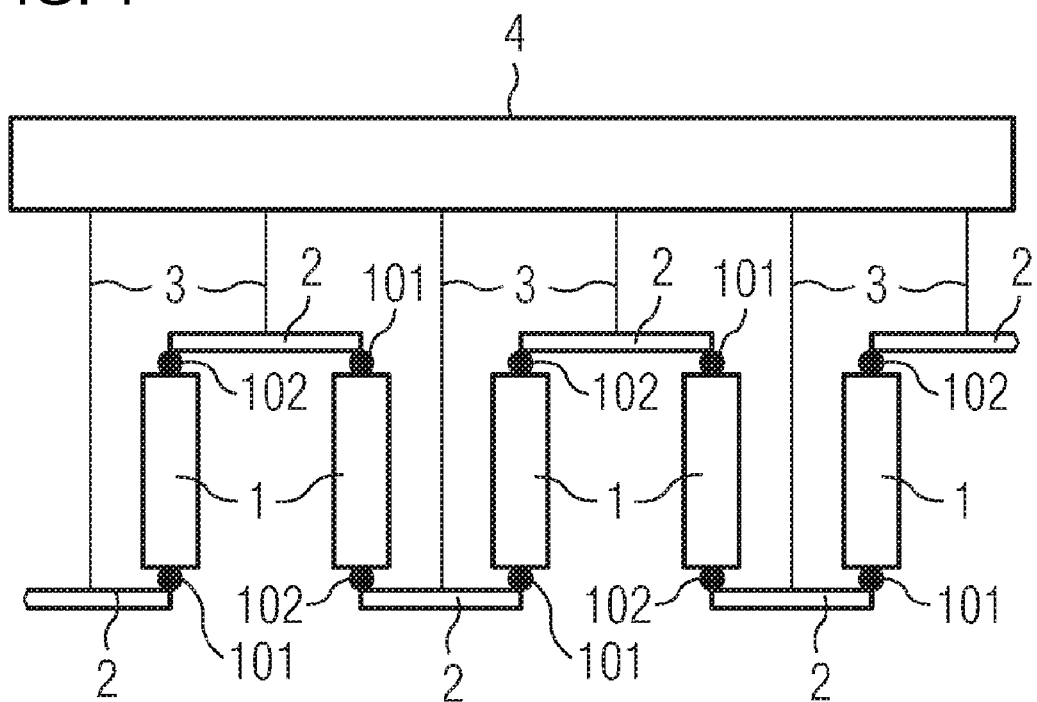
FIG. 1 shows an energy store that consists of a plurality of cells and is monitored by means of an inventive monitoring circuit.

FIG. 1 shows an energy store consisting of a multiplicity of cells. Said cells each make a voltage of nominally 2V available and are connected in series so that the energy store provides a voltage whose nominal value is the product of the number of cells and 2V. With five cells, only a section of the energy store is shown in FIG. 1.

The cells each have a first terminal 101 and a second terminal 102 at which the cells provide their voltage. The first terminal 101 of a cell 1 is in each case connected to the second terminal 102 of the adjacent cells 1 via a contacting lead 2. A monitoring circuit 4 is provided for monitoring the voltages on the individual cells. Connecting leads 3 tap the voltages from in each case the contacting leads 2 to measure the voltage between adjacent contacting leads 2.

Figure 2:
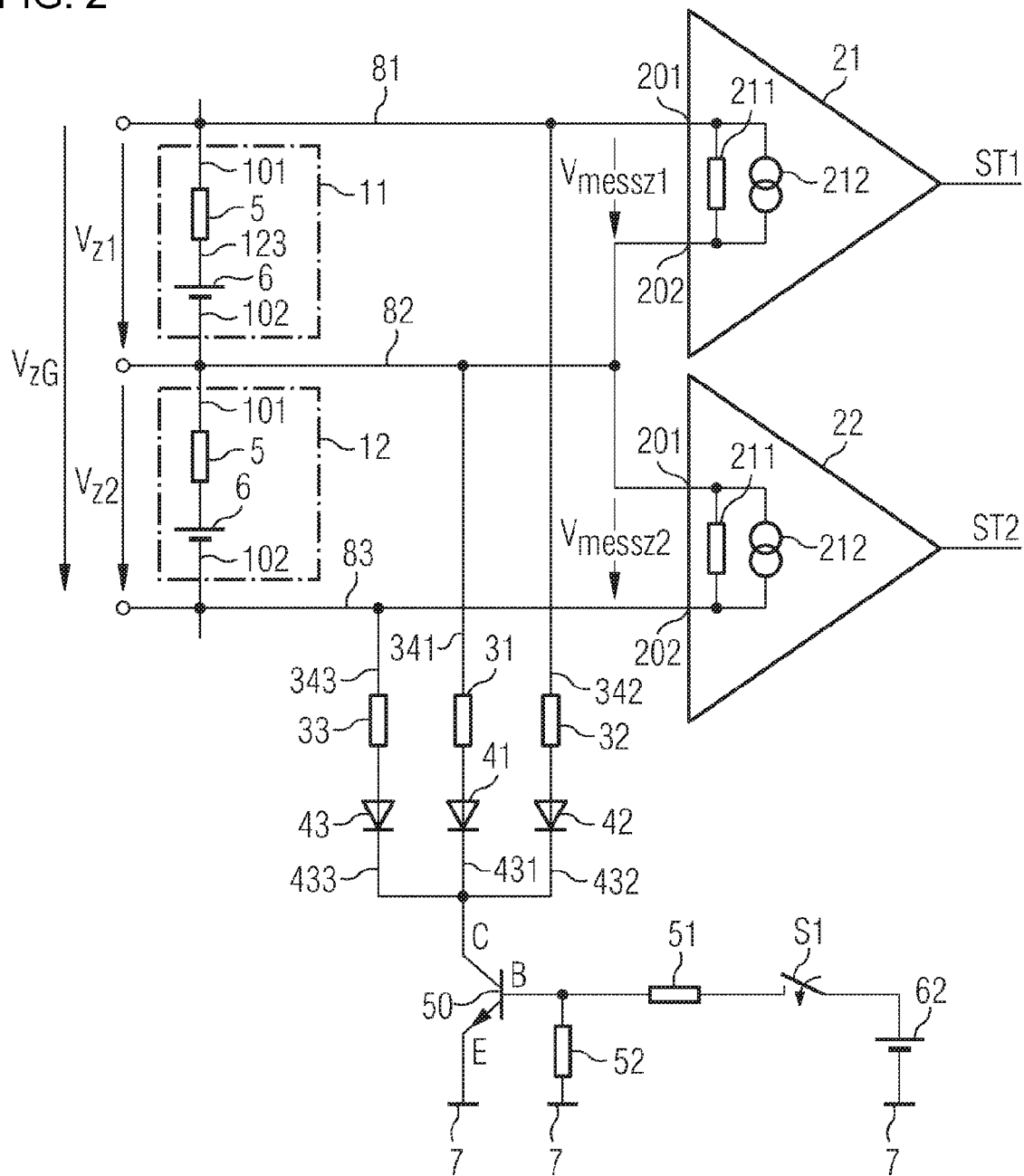
FIG. 2 shows a monitoring circuit for a fault-free energy store.

FIG. 2 shows a section of the energy store with the associated monitoring circuit. What are shown are the cells 11 and 12 of the energy store that are connected in series. The cells 11 and 12 each contain a battery 6 having an internal resistor 5 whose resistance value is no more than a few ohms. The connecting node between the battery 6 and internal resistor 5 is referred to as intermediate node 103. The cells each have a first terminal 101 and a second terminal 102. The second terminal 102 of the first cell 11 is connected to the first terminal 101 of the second cell 12. Not shown in FIG. 2 are further cells which, connected in series, are joined to the second terminal 102 of the second cell 12 and a first terminal 101 of the first cell 11.

The monitoring circuit contains a first voltage-measuring circuit 21 and a second voltage-measuring circuit 22 that each have a first measuring input 201 and a second measuring input 202. The second measuring input 202 of the first voltage-measuring circuit 21 is connected to the first measuring input 201 of the second voltage-measuring circuit 22. Likewise not shown in FIG. 2 are further voltage-measuring circuits which, connected in series, are joined to the first measuring input 201 of the first voltage-measuring circuit 21 and to the second measuring input 202 of the second voltage-measuring circuit 21.

The first terminal 101 of the first cell 11 is connected to the first measuring input 201 of the first voltage-measuring circuit 21 via the first connecting lead 81, while the second terminal 102 of the first cell 11 is connected to the second measuring input 202 of the first voltage-measuring circuit 21 via the connecting lead 82.

The connecting lead 82 hence also forms the connection between the first terminal 101 of the second cell 12 and the first measuring input 201 of the second voltage-measuring circuit 22. The second measuring input 202 of the second cell 12 is connected to the second measuring input 202 of the second voltage-measuring circuit 22 via the connecting lead 83.

The first voltage-measuring circuit 21 and second voltage-measuring circuit 22 each measure the voltage between their first measuring input 201 and second measuring input 202. The voltage-measuring circuits 21 and 22 contain, shown here symbolically, an internal resistor 211 and current source 212 that are connected in parallel between the first measuring input 201 and second measuring input 202. The voltage-measuring circuits 21 and 22 each output status information ST1 or, as the case may be, ST2 at their outputs. The status information ST1 and ST2 can in each case assume three values: Overvoltage, undervoltage and normal voltage.

Connected via the external terminal 341 to the first measuring input 201 of the second voltage-measuring circuit 22 is a series connection formed from the first loading resistor 31 and first diode 41. Conversely, the first measuring input 201 of the first voltage-measuring circuit 21 is connected via the external terminal 342 to a series connection formed from the second loading resistor 32 and second diode 42. Similarly, the second measuring input 202 of the second voltage-measuring circuit 22 is connected via the external terminal 343 to the series connection formed from the third loading resistor and third diode 43.

The series connection formed from the first loading resistor 31 and first diode 41 has external terminals 341 and 431, while the series connection formed from a second loading resistor 32 and second diode 42 has the external terminals 342 and 432 and the series connection formed from the third loading resistor 33 and third diode 43 has the external terminals 343 and 433.

The diodes 41, 42 and 43 are connected by means of their anode to their respective loading resistors 31, 32 and 33, while their cathodes are jointly connected via the external terminals 431, 432 and 433 to the collector of a transistor 50. The emitter of the transistor 50 is connected to the ground 7. The collector-emitter path is referred to also as the load path.

The base of the transistor 50 is connected to a first terminal of a second switching resistor 52 and to a first terminal of a first switching resistor 51. The second terminal of the second switching resistor 52 is connected to the ground 7 and the second terminal of the first switching resistor 51 is connected to a first terminal of a switch S1. The switch S1 is connected at its second terminal to the battery 62.

If switch S1 is open, the base potential is set to ground owing to the current through the resistor 52. The transistor 50 is thereupon switched off. If, conversely, the switch S1 is closed, the base potential will be set to a potential determined by the ratio between switching resistors 51 and 52.

The resistors 51 and 52 are dimensioned such that with the switch closed the base potential will be sufficiently high for the transistor 50 to reliably conduct, which is to say that a current will flow between the collector and emitter. The transistor 50 forms a switch which ensures either that the loading resistors 31, 32 and 33 connect the first measuring input 201 of the second voltage-measuring circuit 22, the first measuring input 201 of the first voltage-measuring circuit 21, and the second measuring input 202 of the second voltage-measuring circuit 22 to the ground 7 or that there is no connection to ground via the loading resistors 31, 32 and 33.

The loading resistors 31, 32 and 33 can of course be switchably connected to the fixed potential ground in another way. For example, switches could be provided in each case between the loading resistors 31, 32 and 33 and the measuring inputs 201 or, as the case may be, 202 of the voltage-measuring circuits 21 and 22.

The loading resistors 31, 32 or 33 can be realized as discrete components, but they can also be implemented using, for instance, integrated MOS transistors having a high-resistance load path.

All the connecting leads are fault-free in FIG. 2. Consequently, in the fault-free condition, when the switch S1 is open it will be possible to precisely measure the voltages on the cells. The first voltage-measuring circuit 21 measures the voltage $V_{Z1}$ being applied between the first terminal 101 and second terminal 102 of the first cell 11. The second voltage-measuring circuit 22 similarly measures the voltage $V_{Z2}$ provided by the second cell 12 between its terminals 101 and 102.

It must therein be taken into account that the resistors 211 of the first measuring circuit 21 and second measuring circuit 22 each have a value of a few Mohm, while the internal resistor 5 of the cells 11 and 12 has a value in the ohm range, for example 1 ohm, and hence can cause falsifying of the measuring result at most in the order of $10^{-6}$.

If, conversely, the switch S1 is closed, there will be an additional path from the inputs of the voltage-measuring circuit to ground.

The resistance value of the resistor 5 of the first cell 11 or, as the case may be, second cell 12 is referred to as $R_i$, the resistance value of the resistors 211 of the voltage-measuring circuits 21 and 22 is $R_h$, and the loading resistors 31, 32 and 33 each have a resistance value of $R_n$.

The potential at the intermediate node 103 of the first cell 11 is referred to as $V_A$ and the potential at the second input of the first cell is referred to as $V_B$. The potentials are each referred to ground at 0V. When the switch S1 is closed, then between the first measuring input 201 and second measuring input 202 of the first voltage-measuring circuit 21 there will be the following voltage $V_{messZ1}$:

$$V_{messZ1} = \frac{V_B}{1 + \frac{R_i}{R_n} + \frac{R_i}{R_h}} - V_A \left[ \frac{1 + \frac{R_i}{R_h}}{1 + \frac{R_i}{R_n} + \frac{R_i}{R_h}} \right] \quad \text{Formula 1}$$

The value for the loading resistor $R_n$ is selected as being from a few kohm to a few tens of kohm. If, for instance, what is selected is $R_i$=1 ohm, $R_n$=1 kohm and $R_h$=1 Mohm it will be seen that the change in the voltage through the loading resistor will be in the $10^{-3}$ range. The difference between the first measured voltage with the switch S1 open and the second measured voltage with the switch S1 closed is only in the order of one thousandth.

Because the voltage-measuring circuits 21 and 22 each only output status information as the measuring result, the outputs usually stay the same. If a normal voltage is output for the first measurement, the result will as a rule be the same for the second measurement. If the measuring leads are operational, which is to say have very low resistance, the measured voltages and hence also the status output will as a rule not change.

Should the voltage on the first cell 11 really be so close to the overvoltage or, as the case may be, undervoltage that the status information changes from the first to the second measurement, then the measured voltage will already be so close to the outage limit that an error message will be appropriate.

Figure 3:
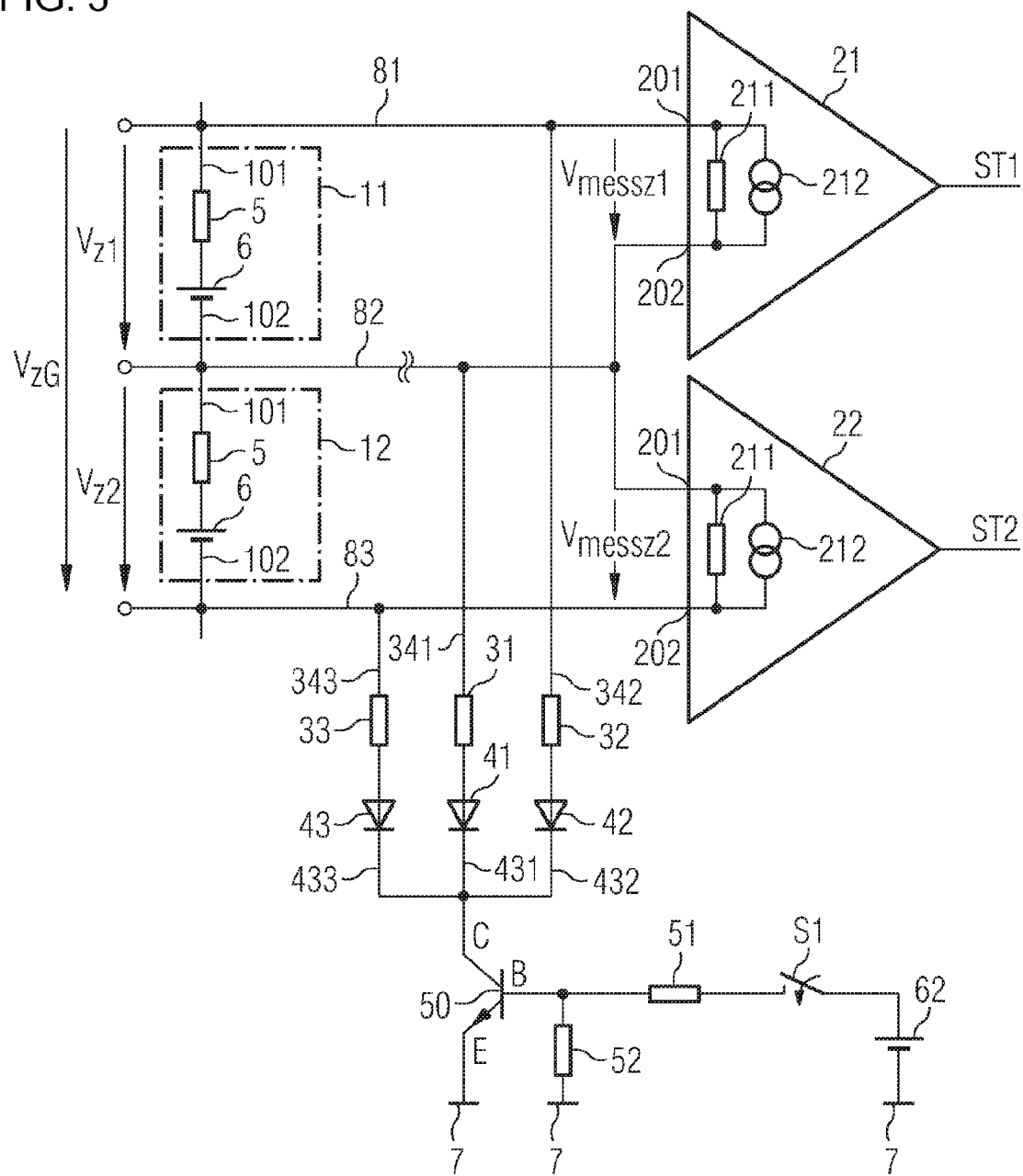
FIG. 3 shows the same monitoring circuit as in FIG. 2 in the case of a defective energy store.

FIG. 3 shows a section of an energy store and the associated monitoring circuit, with FIG. 3 differing from FIG. 2 in that due to a defect in the connecting lead 82 the second terminal 102 of the first cell 11 is no longer connected to the second measuring input 202 of the first voltage-measuring circuit 21 and to the first measuring input 201 of the second voltage-measuring circuit 22.

If a connecting lead has or, as the case may be, a plurality of connecting leads 81, 82, 83 have been interrupted, which is to say are highly resistive, the measured voltages will change owing to the load network that has been added. If the switch S1 is open, a voltage $V_{ZG}$ corresponding to the sum of the voltage $V_{Z1}$ and the voltage on the second cell $V_{Z2}$ will drop between the connecting lead 81 and connecting lead 83.

Because the internal resistors 211 of the voltage-measuring circuits 21 and 22 are the same, $0.5 \cdot V_{ZG}$ will in each case drop at the voltage-measuring circuits 21 and 22. Now if, in the event of a fault, a connecting lead 82 has been interrupted, the voltages will be measured incorrectly. That is because of the ever-present, albeit high-level, input impedance of the measuring circuits 21 and 22.

The resulting measured voltage is in the event of a fault $V_{messz1}=0.5 \cdot (V_{Z1}+V_{Z2})$ for the first voltage-measuring circuit 21 and the voltage measured by the second voltage-measuring circuit 22 is $V_{messZ2}=0.5 \cdot (V_{Z1}+V_{Z2})$. A cell could indeed have 3V cell voltage in the event of a fault and nevertheless no overvoltage would be indicated. Whereas the overvoltage limit is 2.5V, a voltage of (3V+1V)/2=2V would be measured on the two voltage-measuring circuits 21 and 22. Despite the application already of 3V cell voltage, both measuring circuits would hence measure only 2V owing to their own same termination.

With battery- or capacitor-monitoring systems, no monitor function would hence be possible for the circuitry parts in the event of a fault in the form of a broken measuring lead. The fault would remain undetected and the energy storage system would wear out faster or even be destroyed. For that reason, according to the invention only a first measurement is performed with the S1 open and a second control measurement carried out with the switch S1 closed.

Let the potential $V_B$ be the potential at the first input 101 of the first cell 11 and the potential $V_A$ the potential at the second input 102 of the second cell 12. Ignoring the internal resistors 5 of the cells 11 and 12, the result for the voltage $V_{messZ1}$ measured by the first voltage-measuring circuit 21 is:

$$V_{messZ1} = U_B - \frac{(V_A + V_B)\frac{R_n}{R_h}}{1 + 2*\frac{R_n}{R_h}}$$ Formula 2

$$V_{messZ2} = -U_A + \frac{(V_A + V_B)\frac{R_n}{R_h}}{1 + 2*\frac{R_n}{R_h}}$$ Formula 3

The value $$\frac{(V_A + V_B)\frac{R_n}{R_h}}{1 + 2*\frac{R_n}{R_h}}$$

corresponds to the potential $V_{ZW}$ at the first measuring input 201 of the second voltage-measuring circuit 22.

The load network formed from loading resistors 31, 32 and 33, diodes 41, 42 and 43, and transistor 50 should therein be selected as being of sufficiently low resistance for the voltage being applied to the measuring circuit to change significantly enough in the event of a fault for a status change to occur when the load network is added.

Owing to the input impedances of the measuring circuits, the highly resistive voltage divider produced in the event of a fault is turned by the load network into the loaded voltage divider. Current therein flows from the highly resistive terminated/floating network nodes to ground (GND).

Since the measuring circuits (voltage measurement) as a rule have resistances in the >100 kohm to a few megaohm range, a resistance range of a few kohm to a few 10 kohm for the load network is practical or sufficient for effecting a status change. The fault can be detected by means of the load network and resulting status change.

If the value of $R_h$ is selected as being in the Mohm range and the value of $R_n$ in the kohm range, it follows therefrom that said value $$\frac{(V_A + V_B)\frac{R_n}{R_h}}{1 + 2*\frac{R_n}{R_h}}$$

from formulas 2 and 3 is negligibly small compared with the potential $V_B$ or, as the case may be, $V_A$.

With an $R_n$-to-$R_h$ ratio of 1-to-1000, the potential $V_z$ is about one five-hundredth of the potential $V_A$ or, as the case may be, the potential $V_B$. If $V_A$ and $V_B$ are close to 300V, the voltage at the first measuring input 201 of the first voltage-measuring circuit 22 is only around 0.6V in magnitude.

With a defective connecting lead 81 and the switch S1 closed, the second voltage-measuring circuit 21 measures a voltage that is negative and hence with certainty smaller than the voltage $V_{Z2}$. The first voltage-measuring circuit measures a voltage that corresponds substantially to the difference in potential between the first terminal 101 of the first cell 11 and ground. Said voltage $V_{messz1}$ is greater than the $0.5 \cdot (V_{Z1}+V_{Z2})$ determined from the first measurement. What therefore applies is: $V_{messZ1} > 0.5*(V_{z1}+V_{Z2})$; $V_{messZ2} < 0.5*(V_{Z1}+V_{Z2})$.

The first voltage-measuring circuit 21 indicates an overvoltage as status information ST1 and the second voltage-measuring circuit 22 reports an undervoltage as status information ST2, while normal voltage was output during the first measurement of both voltage-measuring circuits 21 and 22.

On the basis of said difference between the first and second measurement it can be recognized that the connecting lead 82 is broken.

The resistance $R_n$ is selected appropriately so that the internal resistance $R_i$ can be ignored in the calculation. If it is selected as being, for example, 10 kohm, then that will ensure that too great a voltage will not drop across the internal resistors. A sufficiently large $R_n$ value will moreover ensure that too much current is not consumed during the second measurement.

The measuring method can be summarized as follows: The measuring leads are loaded unbalanced to ground (GND) by selectively (possibly cyclically) adding what from the measuring circuit's viewpoint is a "low-ohm"—for example 10-kohm—load network.

The load network is switched into the high-resistance measuring path by means of the switch S1 for diagnosis, which results in a change in voltage and, in the end, a status change in the event of a fault. Thus if the status signal changes when S1 is switched, which is to say closed, it means there is a broken lead. If, though, the status remains unchanged, it means the measuring leads are connected to the cells on a low-resistance basis and so there are no broken leads. The switch S1 is activated via a "Diag EN" signal. The signal can be forwarded to S1 via a separate Enable lead, but alternatively also via the interface lead.

The invention claimed is:

1. A monitoring circuit for an energy storage device, the energy storage device having a multiplicity of cells each having a first terminal and a second terminal, that provide a voltage in each case between the first terminal and second terminal, and which are connected in series, wherein in each case the second terminal of a first cell is connected to the first terminal of a second cell, the monitoring circuit comprising:
   at least two voltage-measuring circuits including a first voltage-measuring circuit and a second voltage-measuring circuit each having a first measuring input and a second measuring input, said voltage-measuring circuits each measuring a voltage between said first measuring input and said second measuring input of said voltage-measuring circuits, said second measuring input of said first voltage-measuring circuit is connected to said first measuring input of said second voltage-measuring circuit;
   a first connecting lead for connecting the first terminal of the first cell to said first measuring input of said first voltage-measuring circuit;
   a second connecting lead for connecting the second terminal of the first cell to said second measuring input of said first voltage-measuring circuit; and
   a first loading resistor capable of being switched between said second measuring input of said first voltage-measuring circuit and a first fixed potential.

2. The monitoring circuit according to claim 1, further comprising a second loading resistor capable of being switched between said first measuring input of said first voltage-measuring circuit and a second fixed potential.

3. The monitoring circuit according to claim 2, wherein said voltage-measuring circuits each have an internal resistor between said first and second measuring inputs with an ohmic resistance value of Rh and said first loading resistor and said second loading resistor each have an ohmic resistance value of Rn, wherein the following applies:

$Rn<Rh$.

4. The monitoring circuit according to claim 3, wherein $Rn<10 \cdot Rh$.

5. The monitoring circuit according to claim 2, further comprising:
   diodes and said first loading resistor and said second loading resistor are each connected in series with one of said diodes, and a series connections formed from said loading resistor and said diode each having a first and a second external terminal; and
   a transistor having a load path with a first terminal and a second terminal, said first terminal of said load path connected to the fixed potential and said second terminal of said load path connected to said second external terminals of said series connections formed from said loading resistor and said diode.

6. The monitoring circuit according to claim 2, wherein the first fixed potential and the second fixed potential are at a same potential.

7. The monitoring circuit according to claim 1, further comprising a switch connected in series with said first loading resistor, said series connection and said first loading resistor are connected between said first measuring input of said voltage-measuring circuit and the fixed potential, wherein said switch is switched on and off cyclically.

8. The monitoring circuit according to claim 1, wherein the cells are rechargeable batteries.

9. The monitoring circuit according to claim 1, wherein the cells are embodied as capacitors.

10. The monitoring circuit according to claim 1, wherein the first fixed potential is connected to ground.

11. The monitoring circuit according to claim 1, further comprising:
   a third connecting lead for connecting the second terminal of the second cell to said second measuring input of said second voltage-measuring circuit; and
   a third loading resistor for a connection that can be switched between said second measuring input of said second voltage-measuring circuit and a fixed potential.

12. A method for monitoring an energy storage device, the energy storage device having a multiplicity of cells each having a first and a second terminal that provide a voltage in each case between the first and second terminals and are connected in series, wherein in each case a second terminal of a first cell is connected to a first terminal of a second cell, which comprises the steps of:
   a) providing a monitoring circuit containing:
      at least two voltage-measuring circuits including a first voltage-measuring circuit and a second voltage-measuring circuit each having a first measuring input and a second measuring input, the voltage-measuring circuits each measuring a voltage between the first measuring input and the second measuring input of the voltage-measuring circuits, the second measuring input of the first voltage-measuring circuit is connected to the first measuring input of the second voltage-measuring circuit;
      a first connecting lead for connecting the first terminal of the first cell to the first measuring input of the first voltage-measuring circuit;
      a second connecting lead for connecting the second terminal of the first cell to the second measuring input of the first voltage-measuring circuit; and
      a first loading resistor capable of being switched between the second measuring input of the first voltage-measuring circuit and a first fixed potential;
   b) switching the first loading resistor such that the first loading resistor does not form a connection between the second measuring input of the first voltage-measuring circuit and the first fixed potential;

c) measuring the voltage at the first and second measuring inputs of the first voltage-measuring circuit resulting in a first measurement;
d) switching the first loading resistor such that the first loading resistor forms a connection between the second measuring input of the first voltage-measuring circuit and the first fixed potential;
e) measuring the voltage at the first and second measuring inputs of the first voltage-measuring circuit resulting in a second measurement; and
f) comparing the first measurement with the second measurement.

13. The method according to claim 12, wherein:
at step a) the monitoring circuit is provided in which a second loading resistor is provided capable of being switched between the first measuring input of the first voltage-measuring circuit and a second fixed potential;
at step c) an additional step is provided at which the second loading resistor is switched in such a way that the second loading resistor does not form a connection between the first measuring input of the first voltage-measuring circuit and the second fixed potential; and
at step e) an additional step is provided at which the second loading resistor is switched in such a way that the second loading resistor forms a connection between the first measuring input of the first voltage-measuring circuit and the second fixed potential.

14. The method according to claim 12, which further comprises:
outputting status information in each case during the measuring at step c);
during the measuring at step e), the status information indicating whether one of an undervoltage, an overvoltage and a normal voltage is present; and
in step f), comparing the status information output at step c) with the status information output at step e).

* * * * *